United States Patent

Ali

[11] Patent Number: 6,016,472
[45] Date of Patent: Jan. 18, 2000

[54] SYSTEM AND METHOD FOR INTERFACING A DIGITAL AUDIO PROCESSOR TO A LOW-SPEED SERIALLY ADDRESSABLE STORAGE DEVICE

[75] Inventor: Syed S. Ali, Lehigh County, Pa.

[73] Assignee: Lucent Technologies Inc., Murray Hill, N.J.

[21] Appl. No.: 08/939,533

[22] Filed: Sep. 29, 1997

[51] Int. Cl.[7] .................................................. G10L 9/14
[52] U.S. Cl. ............................................ 704/500; 704/219
[58] Field of Search ................................... 704/200, 219, 704/270, 500; 369/52, 56, 13, 15, 14, 33, 34; 360/12; 379/67.1, 68

[56] References Cited

U.S. PATENT DOCUMENTS 5,535,356 7/1996 Kim et al. ............................... 395/430
5,598,391 1/1997 Mukawa ................................... 369/54
5,623,623 4/1997 Kim et al. ............................... 395/430

*Primary Examiner*—Richmond Dorvil
*Attorney, Agent, or Firm*—Darby & Darby

[57] ABSTRACT

A serially addressable non-volatile storage device, specifically flash memory, is usable for recording digitally compressed audio by providing a software-controlled serial interface between a digital signal processor (DSP) and the storage device, and by storing sampled audio in a sample buffer, encoding and compressing the data, and directing it to an output buffer, and transferring the encoded and compressed data in uniformly-sized blocks to an alternate one of at least two flash buffers in the storage device. While one of the flash buffers is receiving encoded data, the other is used to store its contents in the flash memory in the background, thereby permitting uninterrupted data flow.

8 Claims, 4 Drawing Sheets

SYSTEM AND METHOD FOR INTERFACING A DIGITAL AUDIO PROCESSOR TO A LOW-SPEED SERIALLY ADDRESSABLE STORAGE DEVICE

FIELD OF THE INVENTION

The invention relates to a system and method for interfacing a digital audio processor to a storage device, and more particularly to a system and method for coupling a programmable digital signal processor chip, used in sampling and compressing recorded audio, to a relatively low-speed serially addressable flash memory device.

BACKGROUND OF THE INVENTION

Traditionally, sound has been recorded in consumer applications, such as dictation recorders and telephone answering machines, by way of analog recording. In analog recording, an electrical representation of sound waves is preserved on a storage medium in such a way that the representation can be read to reproduce the original sound waves. Analog recording technology is old and relatively straightforward. In one common type of recording, a sound wave picked up and converted into an electrical signal by a microphone, is amplified and recorded onto magnetic tape passing under a transducer simply by passing the amplified electrical signal to the transducer. To reproduce the sound, the reverse is performed. The magnetic tape passing under the transducer creates an electrical signal in the transducer, which upon amplification can be played via a speaker to reproduce the recorded sound.

This approach, while simple, has several disadvantages. Analog recording units employing magnetic tape have a number of moving parts, are mechanically complicated, and typically consume a substantial amount of power. Moreover, because magnetic tape is a long, linear medium, random access to any location on the tape may require spooling through a substantial length of tape. Finally, it is difficult, expensive, and time-consuming to be able to insert and delete passages between recorded segments of tape.

Accordingly, digital audio recording is now replacing analog audio recording in many different applications. In digital recording, the sound wave picked up and converted into an electrical signal by a microphone is processed by a computer and turned into a sequence of numeric codes, which are then stored in digital memory. Later, these numeric codes can be processed by the computer back into an electrical signal for reproduction via a speaker.

Digital recordings have several advantages over their analog counterparts. First, by employing digital memory for storage, there is no need for any moving parts. Accordingly, digital audio recording units can be more reliable and durable than comparable analog recorders. Also, because no motors or magnetic transducers are necessary, digital recorders can consume less power. Finally, because recording is not accomplished on a long piece of linear medium, such as a magnetic tape, it is possible for digital memory to be accessed in a non-sequential manner without the delay inherent in spooling a magnetic tape to a specified location.

Several factors are making the adoption of digital audio recording more feasible for consumer applications. First, the cost of digital components, particularly memory, has decreased drastically within the last several years. Second, only recently have digital signal processors with sufficient throughput and capable of performing audio compression been developed.

Even with advanced compression techniques, providing adequate recording quality still requires a large amount of digital storage. As much as prices have come down, the cost of digital storage remains a limiting factor. For example, to record five minutes of a single channel of CD-quality sound (sampled at 44.1 kHz with 16-bit sample resolution), without compression, over 200 megabits of storage are necessary. However, this storage requirement can be reduced in several ways. The sample rate can be reduced; this will decrease the frequency response of the recorded sound, causing high frequencies to be lost. The sample resolution can be reduced; this increases the signal-to-noise ratio in the sound. Compression schemes can be used; these typically affect reproduction fidelity in various ways. By employing all of these techniques in combination, the most advanced compression schemes permit five minutes of audio to be reduced to less than two megabits of storage, less than one percent of the original storage requirement. This level of compression will provide reproduction quality acceptable for voice recording, for example in telephone answering machines. However, two or more megabits of memory is still a significant amount of memory for a consumer-oriented device, intended to be sold at a relatively low price.

Traditional low-cost digital memory devices have a significant disadvantage. When power is removed, the memory contents are permanently lost. For example, the most common and least expensive type of digital memory usable for audio recording is dynamic random-access memory (dynamic RAM). Audio grade dynamic RAM, which may be partially defective (and thus not usable in data-storage applications) is known as ARAM. When power is disconnected from ARAM, the memory contents are lost. Moreover, ARAM must be periodically "refreshed" by electrically stimulating the memory cells. For these reasons, a battery backup must be provided to preserve ARAM contents when the device is removed from its primary power source. This is inconvenient for the user and adds bulk and expense to a device that uses ARAM. Moreover, additional circuitry can be necessary to provide the necessary refresh signals to the ARAM.

Despite their disadvantages, ARAM devices are in relatively high demand because of their low price point. Accordingly, ARAM devices are sometimes in short supply, causing their price advantage to be nullified.

Another type of volatile digital memory is known as static RAM. Static RAM is typically very fast, but is also power-consuming and expensive. No refresh signals are necessary, but like dynamic RAM, power must be continually supplied to the device, or memory contents will be permanently lost.

Several types of non-volatile memory are also available. EEPROM, or Electrically Erasable Programmable Read-Only Memory, is expensive in the quantities and densities necessary for audio storage. So-called bubble memory is also available; it, too, is expensive, and is generally too slow for advantageous use in audio recording. Finally, flash memory is available. Traditionally, flash memory has been expensive, and very slow to erase and to write. In recent years, the time required to program flash memory has been reduced, and it is now usable for audio recording. However, most varieties are still very expensive. Moreover, flash memory is subject to a burnout effect. After a limited number of re-writes, the device will wear out and become unusable.

In light of the disadvantages of the various volatile and non-volatile digital storage options for voice recording, there is a recognized need for a digital audio recording system that is inexpensive and reliable and uses sufficiently fast non-volatile memory.

SUMMARY OF THE INVENTION

The invention uses a low-cost programmable digital signal processor (DSP) in conjunction with a recently developed low-cost (but slow) serially addressable flash memory device to provide for digital recording and reproduction in a consumer device, such as a telephone answering device. Because flash memory is used, the recording is nonvolatile, and no battery backup or refresh circuitry is required to prevent loss of data when a power failure is encountered.

The serial interface of the flash memory is directly interfaced to input/output lines of the digital signal processor, so no expensive additional interface logic is necessary. Thus, the complexity and expense of a digital audio recording device according to the invention is reduced in comparison to devices that use other interface techniques.

The flash memory device is still relatively slow. However, a time-slicing and buffer manipulation scheme allows the flash memory device to accommodate digital audio recording in a transparent and efficient manner.

In this scheme, two buffers are used. While data from one buffer is being written to flash memory in the background, the other buffer continues to receive audio data from the DSP. The buffers are allowed to completely fill before being written to the flash memory, thereby minimizing the number of flash memory writes and reducing the incidence of flash burnout.

In one embodiment of the system, a DSP1605 digital signal processor available from the Microelectronics Group of Lucent Technologies, Inc. ("Lucent Microelectronics"), is programmed and used as the digital signal processor, and an AT45D041 Serial DataFlash 4-megabit flash memory from Atmel Corporation is used as the flash memory device.

BRIEF DESCRIPTION OF THE DRAWINGS

These and other objects, features, and advantages of the invention will become apparent from the detailed description below and the accompanying drawings in which.

DESCRIPTION OF THE PREFERRED EMBODIMENT

The invention is described below, with reference to detailed illustrative embodiments. It will be apparent that a system according to the invention may be embodied in a wide variety of forms. Consequently, the specific structural and functional details disclosed herein are representative and do not limit the scope of the invention.

Figure 1:
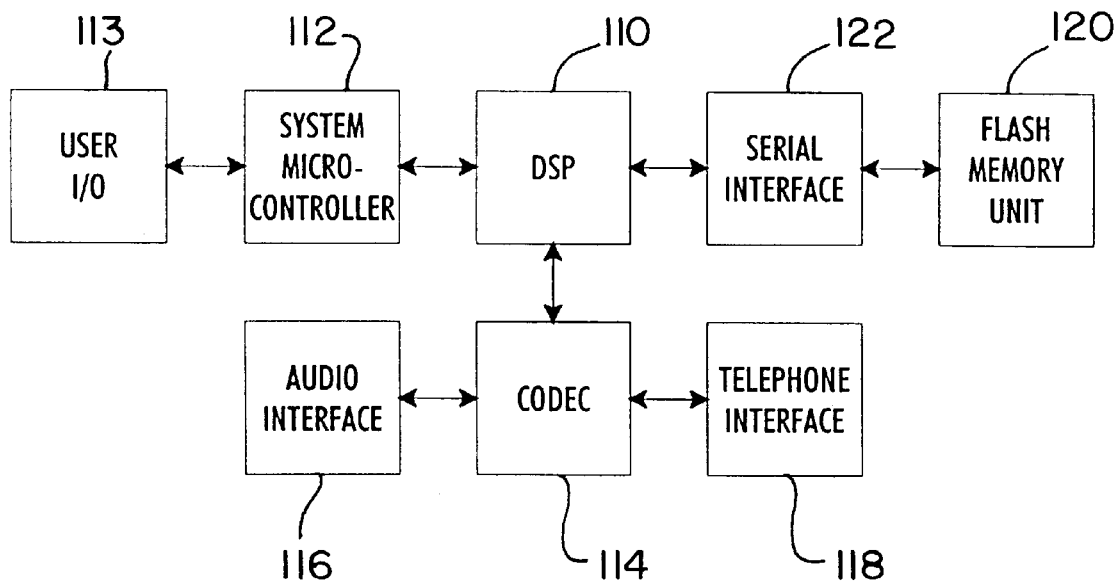
FIG. 1 is a block diagram of an illustrative telephone answering device that uses the digital signal processor and flash memory device interface of the invention.

Referring initially to FIG. 1, the interrelationships among the functional components of a telephone answering device according to the invention are shown. A digital signal processor (DSP) 110 is the heart of the device. The DSP 110 is coupled to a system microcontroller 112, which directs the operation of the telephone answering system by means known in the art. For example, the microcontroller 112 communicates with a user I/O interface 113, which may include such components as a digital display and push-button switches.

Also coupled to the DSP 110 is a signal coder and decoder (CODEC) 114. The CODEC 114 is capable of performing analog-to-digital and digital-to-analog conversions; it acts as an interface between the DSP 110, which receives and processes data in digital form, and the analog audio signals of the outside world. Accordingly, the CODEC 114 is coupled to an audio interface 116, which includes a microphone and a speaker, and a telephone interface 118, which connects the telephone answering device to the telephone system. The CODEC 114 is used to convert analog audio signals received from the audio interface 116 and the telephone interface 118 into digital data that can be processed by the DSP 110 (a process known as "sampling"); it is also used to convert the DSP's digital data back to analog audio signals when necessary for playback.

In one embodiment of the invention, the CODEC 114 and the DSP 110 are separate integrated circuits. For example, the DSP 110 can be a chip selected from the DSP160x family of digital signal processors from Lucent Microelectronics; a preferred embodiment of the invention uses the DSP1605 chip. This chip includes 1,024 16-bit words of on-board random-access memory (RAM) and 16K of on-board program read-only memory (ROM) into which the telephone answering device functionality is programmed. In this embodiment, the CODEC 114 is a separate analog-to-digital and digital-to-analog converter, such as the T7513B CODEC, also available from Lucent Microelectronics. In an alternative embodiment of the invention, the CODEC 114 and the DSP 110 are incorporated into the same integrated circuit chip; examples of this configuration are found in the DSP165x family of devices from Lucent Microelectronics.

A low-speed flash memory unit 120 is used for the long-term storage of recorded audio. Unlike in most electronic telephone answering devices, the DSP 110 communicates with the flash memory unit 120 by way of a serial interface 122.

The flash memory unit 120 comprises the sole means of long-term data storage used by the telephone answering device. Accordingly, the flash memory unit 120 includes regions reserved for the storage of the outgoing message, incoming messages, and system-specific data (such as, for example, a message table that identifies the stored incoming messages by a time and date stamp and identifies where the messages are located within the flash memory). In addition, the flash memory can store voice data representative of a number of voice prompts (e.g. the numerals and words used to speak message time-and-date stamps to the user). Although such voice prompt data typically would be permanently programmed in ROM at the factory and never altered in normal use of a telephone answering system, it has been found that flash memory is sufficiently reliable that the remaining portions of a telephone answering device are likely to wear out or break before there is any trouble with the permanent voice prompts stored in flash memory. By programming the flash memory with the voice prompt data, no additional external ROM is necessary to store the voice prompts, thereby reducing chip count and potentially reducing production costs.

If power is removed from the telephone answering device, the system-specific data can be used to reconstruct any real-time data necessary for the operation of the system.

Figure 2:
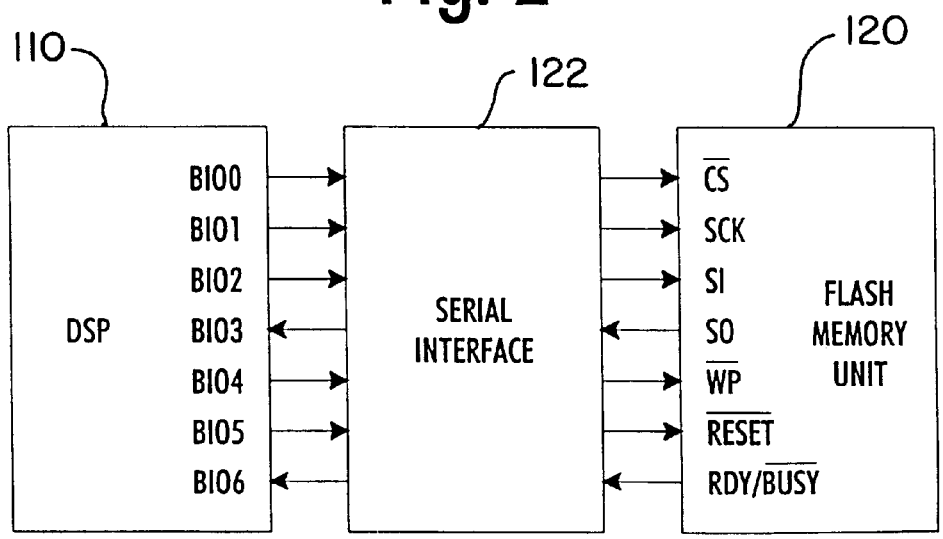
FIG. 2 is a partial functional schematic diagram illustrating the electrical interface between the digital signal processor and the flash memory device of FIG. 1.

The serial interface 122 between the DSP 110 and the flash memory unit 120 is illustrated in greater detail in FIG. 2. A DSP 110 usable in the invention should have the ability to control, via software, the logic state of several input/output lines. This capability need not be present in the DSP 110 itself, but can be implemented in external serial interface logic 122, if necessary. The DSP1605 from Lucent Microelectronics, used in a preferred embodiment of the invention, has the built-in ability to control eight bidirectional input/output lines. Accordingly, the DSP1605 is capable of directly interfacing with the flash memory unit 120 with essentially no additional external interface logic, i.e. interface 122 can be eliminated and the units directly connected together. In such a case the interface could be considered only direct cable data connection.

In a preferred embodiment of the invention, the flash memory unit 120 is an AT45D041 Serial DataFlash 4-megabit unit available from Atmel Corporation. The Atmel Serial DataFlash devices in the AT45Dxx1 family are available in several capacities; the 4-megabit capacity device is preferred in an embodiment of this invention as providing a sufficient amount of storage at an acceptable price. Regardless of the particular device used, the flash memory unit 120 has a built-in serial interface which can operate with the interface of a DSP1605. Audio-grade versions of the Atmel devices are presently available at relatively low prices, but can be up to twenty times slower than other flash memory devices (i.e., those without serial interfaces).

The Atmel AT45D041 flash memory is controlled by manipulating seven input/output lines. A chip select ($\overline{CS}$) input is driven to a low logic state to indicate the beginning of a command to the flash memory; the $\overline{CS}$ input remains low for the duration of the command and is brought back up to a high state to complete the command. The $\overline{CS}$ input on the flash memory unit 120 is coupled to a first bit input/output BIO0 on the DSP 110. A serial clock (SCK) input on the flash memory unit 120 is driven by a second bit input/output BIO1 on the DSP 110; each bit of serial data passed between the DSP 110 and the flash memory unit 120 is considered valid when the SCK input makes a low-to-high transition. A serial input (SI) line on the flash memory unit 120 is driven by a third bit input/output BIO2 on the DSP 110; data is passed from the DSP 110 to the flash memory unit 120 by setting the SI logic level appropriately before the SCK line is driven from low to high. A serial output (SO) line on the flash memory unit 120 drives a fourth bit input/output BIO3 on the DSP 110; data is passed from the flash memory unit 120 to the DSP 110 by setting the SO logic level appropriately before the SCK line is driven from low to high. A write-protect ($\overline{WP}$) input on the flash memory unit 120 is coupled to a fifth bit input/output BIO4 on the DSP 110; holding this input low causes the first 256 sectors of the flash memory to be protected from all write operations. A reset ($\overline{RESET}$) input on the flash memory unit 120 is coupled to a sixth bit input/output BIO5 on the DSP 110; bringing this input low causes the flash memory to stop operating and resume an idle state. Finally, a ready/busy ($RDY/\overline{BUSY}$) output from the flash memory unit 120 to a seventh bit input/output BIO6 on the DSP 110 indicates, by transitioning from a low logic state to a high logic state, when the flash memory has finished performing certain operations.

All of the bit input/output lines BIO0 through BIO6 are controlled and read via software on the programmed DSP 110. For a detailed description of the serial input/output protocols and signal timing relationships necessary for proper operation of the Atmel AT45D041 Serial DataFlash device, see the Atmel product data sheet for the AT45D041, which is incorporated by reference as though set forth in full herein.

The disclosed embodiment of the invention, which utilizes a DSP1605 device from Lucent Microelectronics, has bidirectional bit input/output lines for each of BIO0 through BIO6. However, it should be noted that none of these lines is bidirectional in function. The $\overline{CS}$, SCK, SI, $\overline{WP}$, and $\overline{RESET}$ lines are outputs from the DSP 110 and inputs to the flash memory unit 120, and the SO and $RDY/\overline{BUSY}$ lines are outputs from the flash memory unit 120 and inputs to the DSP 110.

Figure 3:
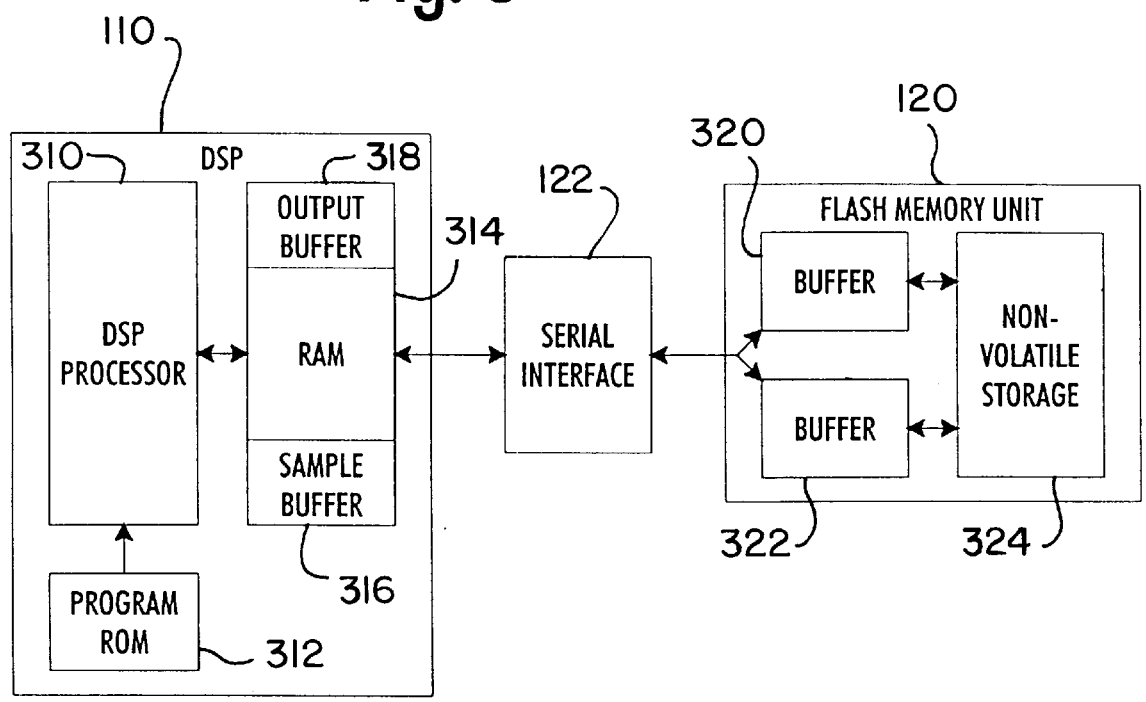
FIG. 3 is a block diagram showing the buffer manipulation operations performed by the telephone answering device of FIG. 1.

Several internal features of the DSP 110 and the flash memory unit 120 are important and are illustrated in FIG. 3. The DSP 110 has an internal DSP processor 310. The processor 310 is coupled to a program ROM 312, which stores the program code necessary to implement the functionality of the telephone answering device, including the recording and compression operation that will be discussed in further detail below, in conjunction with the flowchart of FIG. 4.

The processor 310 is also coupled to internal RAM 314. The Lucent DSP1605 device has 1,024 words of RAM 314. A portion of the RAM 314 is used for the storage of variables and other data temporarily used by the program stored in the ROM 312. A sample buffer 316 is also allocated within the RAM 314. The sample buffer 316 is used to hold the raw recorded digital sound data received from the CODEC 114 before processing is performed. The DSP processor 310 operates on the data in the sample buffer 316 and stores its output in an output buffer 318 which is also allocated from the RAM 314. The functions performed in this operation will be discussed in further detail below.

The flash memory unit 120 has two internal flash buffers 320 and 322, which are coupled to a plurality of sectors of non-volatile flash storage 324. In the Atmel AT45D041 device, there are 2048 sectors of flash storage, each of which is 264 bytes in size; both internal flash buffers 320 and 322 are also 264 bytes in size.

In programming the flash memory unit 120 in a manner according to the invention, data is transferred from the DSP's output buffer 318 via the serial interface 122 to one of the flash buffers 320 or 322. A command from the DSP 110 will cause the appropriate flash buffer 320 or 322 to be programmed into a sector of the non-volatile storage 324.

Figure 4:
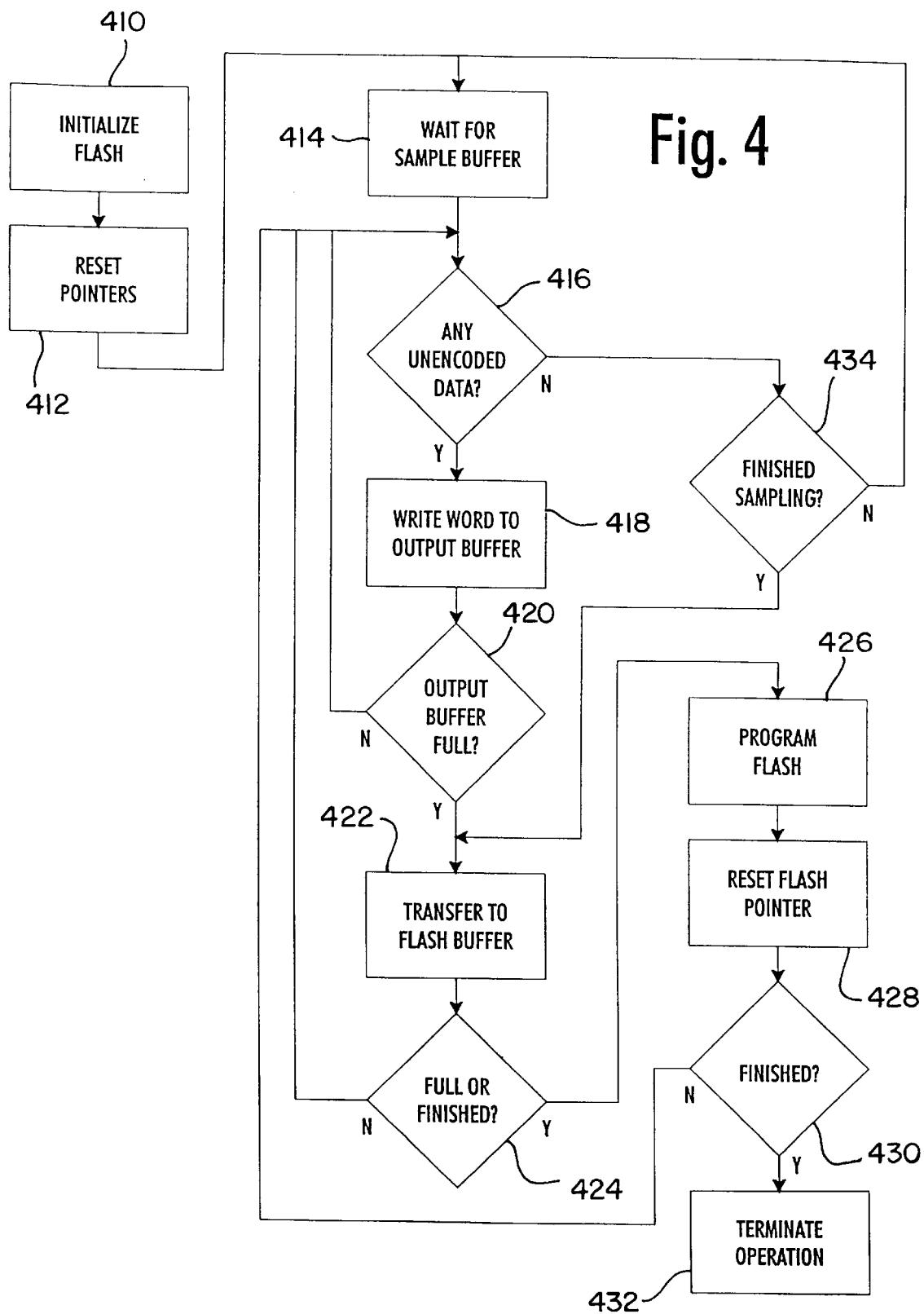
FIG. 4 is a flowchart illustrating the processing flow of the audio recording operation performed by the telephone answering device of FIG. 1.

FIG. 4 illustrates the operation of the DSP-to-flash memory interface by way of a flowchart. In general terms, as discussed above, small intervals or "frames" of samples are digitally recorded (in the traditional manner) into a relatively small sample buffer. When one full frame of samples has been collected, encoding begins on that frame while sampling continues into another portion of the sample buffer. The samples are processed, encoded, compressed, and stored into a 32-byte (or 16-word) output buffer. When that buffer is full, its contents are transferred via the serial interface into one of two flash buffers, and the output buffer is reset. After eight 32-byte blocks have been transferred into the flash buffer, the flash buffer will also be full. The full flash buffer is then programmed into a sector of the flash memory. This operation takes some time, so it is performed in the background while the second flash buffer is filled. Hence, the flash buffers are filled and used to program the flash memory in an alternating fashion, preventing the relatively slow flash programming operation from disrupting the sampling and encoding operations.

The sampling and storage operation will now be considered in detail. First, before audio recording begins, the flash memory is initialized (step 410). In the initialization process, each sector in the non-volatile storage is tested and erased. Any defective sectors are identified and flagged so they will not be used later. If the DSP and flash memory are used in the context of a telephone answering device or a dictation recorder, then a default message table can be constructed at this time.

After the flash memory is initialized, the first flash buffer 320 is selected for subsequent write operations, and a pointer within the output buffer 318 and a pointer within the selected flash buffer 320 or 322 are reset to point to the beginning of the respective buffers (step 412).

Figure 5:
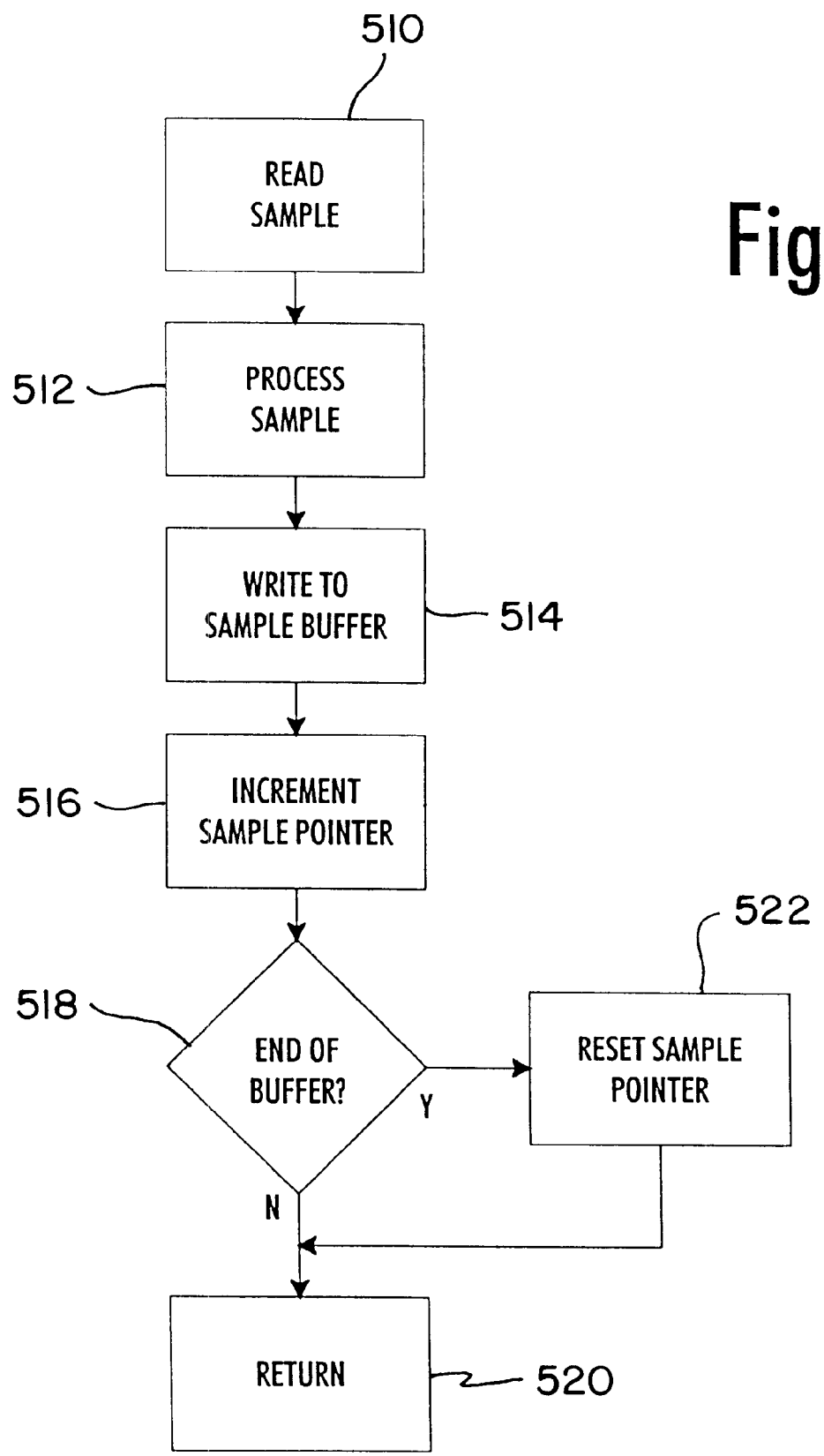
FIG. 5 is a flowchart illustrating the processing flow of the audio sampling operation performed while the audio recording function of FIG. 4 is running.

The process then waits for the sample buffer 316 to be filled by incoming audio samples (step 414). Samples are received via a separate interrupt-driven procedure, which will be discussed in further detail below in connection with FIG. 5. In general, a 20-millisecond interval is stored in the sample buffer 316, which at an 8,000 Hz sample rate, corresponds to 160 samples.

When the sample buffer is full, or when no more sampling is being performed (e.g., when recording is completed), the just-recorded frame within the sample buffer is checked for the presence of unencoded data (step 416). If there is any, encoding is undertaken and a single word of encoded and compressed audio is generated and written to the output buffer 318 (step 418).

The encoding process involves at least two substeps. First, the sample data can be checked for the presence of telephone system dialing codes (i.e., DTMF), which can be passed, if desired, to the system microcontroller 112 to permit remote control of the telephone answering device.

The sample data is then compressed. In one embodiment of the invention, the CELP+compression scheme is used for this purpose. CELP ("Code Excited Linear Prediction") compression schemes are discussed in general in Campbell, Jr. et al., "The Federal Standard 1016 4800 bps CELP Voice Coder," *Digital Signal Processing*, v.1, n.3, pp. 145–155 (1991). The CELP+algorithm is taken from the family of CELP algorithms set forth in Federal Standard 1016.

Like most audio compression algorithms, the CELP+ compression scheme operates on a fixed frame size. That is, evenly sized groups of samples are processed into compressed frames having variable sizes. For purposes of this invention, 20 millisecond frames (which contain 160 samples each at a sample rate of 8 kHz) have been found to yield satisfactory performance. The CELP+compression algorithm has been found to generate in the neighborhood of 16 bytes of compressed data for each sampled 20 ms interval containing sound; this quantity can and does vary, especially if part or all of the interval is silent. Accordingly, a flash memory device having a 4 megabit capacity is capable of storing over 10 minutes, and in some circumstances more than 15 minutes, of compressed audio. The CELP+ compression scheme used by the invention is computationally intensive, but as discussed above, provides acceptable quality speech reproduction with a high amount of compression.

After the single byte of data is written to the output buffer 318, which in one embodiment has a 32-byte (or 16-word) capacity, the output buffer 318 is checked to determine whether it is full (step 420). If not, the sample buffer 316 is again checked for unencoded data (step 416), and encoding continues. If the output buffer 318 is full, then the contents of the output buffer 318 are transferred to the selected flash buffer 320 or 322 over the serial interface 122 (step 422). At that time, the pointer in the output buffer 318 is reset.

If the transfer of 32 bytes from the output buffer 318 to the selected flash buffer 320 or 322 did not fill the flash buffer (step 424), then processing again resumes by checking the sample buffer 316 for unencoded data (step 416). On the other hand, If the flash buffer 320 or 322 is full, then an erase and program command is sent to the flash memory unit 120 to initiate programming the flash buffer to a sector of the flash non-volatile storage 324 (step 426). At this time, a variety of low-level maintenance functions can be performed. For example, memory status can be checked to verify that a sufficient number of free sectors still exist to accommodate further recording. Also, for example, the message table can be updated to reflect the newly programmed sector.

The pointer to within the flash buffer is then reset, and the operative flash buffer is switched (step 428). If the first flash buffer 320 is full and being programmed into the flash memory, then the second flash buffer 322 can begin to be used to accept encoded data, and vice versa.

If sampling is complete, and the previous write to flash memory represented the end of the unencoded data (step 430), then the recording operation is finished and is terminated (step 432). Otherwise, the status of the sample buffer is again checked (step 416), and encoding continues.

If a check of the sample buffer (step 416) determines that there is no unencoded data left, then a check is also made to determine whether sampling has finished (step 434). If so, then any data in the output buffer 318 is transferred to the appropriate flash buffer (step 422), and processing continues to program the flash buffer into the flash memory (step 426), if necessary. Before programming the flash buffer into the flash memory, the status of the flash memory unit is monitored to determine whether the prior programming operation (if any) has completed. The newly filled flash buffer cannot be programmed until the prior programming operation is finished.

If sampling has not finished (step 434), then the recording operation again waits for the sample buffer to be filled with another 20-millisecond interval of samples (step 414).

In this manner, transfers from the output buffer 318 to the flash buffers 320 and 322 are performed only when the 32-byte output buffer is full, thereby minimizing the overhead inherent in performing a software-based serial data transfer between the two devices. Moreover, the flash buffers 320 and 322 are programmed into a sector of flash memory only when they are completely full or when recording is completed, thereby minimizing the number of flash program operations, and reducing the incidence of the flash burnout effect.

It should be noted that under ordinary circumstances, a low-speed flash memory unit 120 such as the Atmel AT45D041 Serial DataFlash device would be unsuitable for real-time digital audio recording. The CELP+compression scheme used in the disclosed embodiment of this invention, as well as in other audio compression applications, operates best on 20-millisecond intervals of sampled speech; longer intervals have been found to be unworkable. Accordingly, after every 20 ms of sampling, the sampled audio data must be compressed and stored. It has been found that performing the compression operation with a DSP 110 such as the Lucent DSP1605 device takes approximately 14–15 ms, and that other processing overhead takes approximately one more millisecond. Accordingly, after compression and processing steps are performed, only 4–5 ms will remain before the next sample interval is ready for processing. The compressed data must be stored or otherwise disposed of in that time. Traditional memory devices (such as ARAM and high-speed flash memory) can write the compressed data to memory in less than a single millisecond, so no special buffer manipulation is necessary. However, the Atmel Serial DataFlash devices can take 7–14 ms to program a page to non-volatile flash memory. Thus, the buffer manipulation scheme used in this invention is useful to permit such a low-speed memory device to keep up with the data compression.

While the recording operation (FIG. 4) is waiting for the sample buffer to be filled, an interrupt-driven sampling process fills the buffer with recorded samples. The sampling process is set forth in FIG. 5. In one embodiment of the invention, sampling is performed at a rate of 8 kHz. Accordingly, every 125 microseconds, the sampling process is invoked, and a sample is read from the CODEC 114 (step 510). The sample is then processed (step 512) by converting it, if necessary, from a non-linear format (such as $\mu$-law, discussed below) to linear. The data is then normalized, or adjusted in amplitude, to a preferred level.

The processed sample is then written to the sample buffer 316 (step 514) as a single 16-bit word, and a pointer within the sample buffer 316 is incremented (step 516).

As discussed above, in one embodiment of the invention, samples are taken by the CODEC 114 at an 8 kHz rate with 8-bit $\mu$-law (non-linear) sample quantization resolution; this quantization scheme is well known in the art. 8-bit $\mu$-law samples are logarithmically quantized and typically have improved signal-to-noise characteristics in comparison to 8-bit linear samples. In an alternative embodiment of the invention, sampling is performed at 8 kHz with 14-bit linear resolution. In either case, in the 20 ms interval, 160 samples are taken and stored in the sample buffer. One frame of samples can be stored in 320 bytes or 160 16-bit words; the sample buffer should be larger than 160 words in size to accommodate encoding one frame of samples while additional samples continue to be taken. If the encoding process takes, for example, 5 ms, then the sample buffer 316 should be 200 words in size (160 words for one frame of samples, and 40 words to accommodate 5 ms of additional samples while the frame is being encoded).

After the pointer is incremented, the position of the sample buffer pointer is compared to the size of the sample buffer 316 (step 518). If the pointer is past the end of the buffer, then the sample buffer pointer is reset to the beginning of the sample buffer 316. Consequently, the sample buffer 316 is circular; when the end is reached, it "wraps around" to the beginning.

After a sample is read, processed, and stored, control is returned (step 520) to the recording operation, which then continues.

The other operations performed by a telephone answering device according to the invention are traditional in nature. See, for example, the Product Note for the Lucent LJ30 NAND FlashTAD telephone answering device subsystem, which is incorporated by reference as though set forth in full herein. The LJ30 is capable of using certain standard types of flash memory for digital voice storage, but not the serially-addressable flash devices discussed herein.

It should be observed that while the foregoing detailed description of various embodiments of the present invention is set forth in some detail, the invention is not limited to those details and a digital audio recording device made according to the invention can differ from the disclosed embodiments in numerous ways. In particular, it will be appreciated that embodiments of the present invention may be employed in many different applications to record a relatively constant stream of data in a relatively slow storage medium. While certain particular parts from Lucent Technologies, Inc. and Atmel Corporation are disclosed as being operable in a system according to the invention, other electronic components, including custom devices, having the essential attributes discussed above also may function as described. Hence, the appropriate scope hereof is deemed to be in accordance with the claims as set forth below.

What is claimed is:

1. A method of recording and storing audio data in a serially addressable flash memory unit comprising a plurality of sectors of non-volatile storage media comprising the steps of:

selecting one of a plurality of flash buffers coupled to the non-volatile storage;

sampling the audio data using a digital signal processor (DSP) connected to a random access memory (RAM);

storing the sampled audio data in a sample buffer in the RAM;

encoding the contents of the sample buffer using the DSP and saving the encoded data to an output buffer in the RAM;

when the output buffer is full, moving the contents of the output buffer to the selected flash buffer via an interface;

when the selected flash buffer is full, programming a sector of the non-volatile storage media with the contents of the selected flash buffer and selecting an alternate flash buffer from the plurality of flash buffers; and repeating the sampling, storing, encoding, moving, and programming steps.

2. The method of recording and storing audio data set forth in claim 1, wherein the sampling and storing steps are performed in an interrupt-driven sampling operation, and the encoding, moving, and programming steps are performed in a concurrently-executing recording operation.

3. The method of recording and storing audio data set forth in claim 1, wherein the selecting step selects one of two flash buffers included within the flash memory unit.

4. The method of recording and storing audio data set forth in claim 1, wherein the storing step comprises the substeps of:

converting the audio data to a linear format; and normalizing the audio data to a preferred level.

5. The method of recording and storing audio data set forth in claim 4, wherein the encoding step comprises compressing the audio data prior to directing the audio data to the output buffer.

6. The method of recording and storing audio data set forth in claim 5, wherein the compressing step utilizes the code excited linear prediction compression algorithm.

7. The method of recording and storing audio data set forth in claim 1, wherein the moving step comprises the substeps of:

sending the contents of the output buffer to the selected flash buffer by transmitting the contents over a serial interface;

clearing the contents of the output buffer; and resetting a pointer to the beginning of the output buffer.

8. The method of recording and storing audio data set forth in claim 1, wherein the programming step comprises the substeps of:

sending a program command from the digital signal processor to the flash memory unit;

storing data in the flash buffer in sectors of the non-volatile storage media, and resetting a pointer to the beginning of the flash buffer.

* * * * *